(12) United States Patent
Fuhrmann et al.

(10) Patent No.: US 10,872,887 B2
(45) Date of Patent: Dec. 22, 2020

(54) SCALABLE VOLTAGE SOURCE

(71) Applicant: AZUR SPACE Solar Power GmbH, Heilbronn (DE)

(72) Inventors: Daniel Fuhrmann, Heilbronn (DE); Wolfgang Guter, Stuttgart (DE); Victor Khorenko, Neuenstadt a.K. (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 0 days.

(21) Appl. No.: 15/158,051

(22) Filed: May 18, 2016

(65) Prior Publication Data
US 2016/0343704 A1    Nov. 24, 2016

(30) Foreign Application Priority Data

May 18, 2015  (DE) .................. 10 2015 006 379

(51) Int. Cl.
*H01L 29/66*  (2006.01)
*H01L 27/08*  (2006.01)
(Continued)

(52) U.S. Cl.
CPC ...... *H01L 27/0814* (2013.01); *H01L 23/3171* (2013.01); *H01L 29/0692* (2013.01);
(Continued)

(58) Field of Classification Search
CPC . H01L 27/0814; H01L 29/0692; H01L 29/20; H01L 29/861; H01L 29/8613;
(Continued)

(56) References Cited

U.S. PATENT DOCUMENTS 4,127,862 A    11/1978  Ilegems et al.
4,179,702 A  * 12/1979  Lamorte ............. H01L 25/0756
                                                           136/249
(Continued)

FOREIGN PATENT DOCUMENTS

CN    102651416 A    8/2012
CN    103403874 A    11/2013
(Continued)

OTHER PUBLICATIONS

Cotal et al., "III-V multijunction solar cells for concentrating photovoltaics", Energy Environmental Science 2 (2009) pp. 174-192.*
(Continued)

*Primary Examiner* — Jay C Kim
(74) *Attorney, Agent, or Firm* — Muncy, Geissler, Olds & Lowe, P.C.

(57) ABSTRACT

A scalable voltage source having a number N of mutually series-connected partial voltage sources designed as semiconductor diodes, wherein each of the partial voltage sources comprises a p-n junction of a semiconductor diode, and each semiconductor diode has a p-doped absorption layer, wherein the p-absorption layer is passivated by a p-doped passivation layer with a wider band gap than the band gap of the p-absorption layer and the semiconductor diode has an n-absorption layer, wherein the n-absorption layer is passivated by an n-doped passivation layer with a wider band gap than the band gap of the n-absorption layer, and the partial source voltages of the individual partial voltage sources deviate by less than 20%, and between in each case two successive partial voltage sources, a tunnel diode is arranged.

16 Claims, 3 Drawing Sheets

(51) Int. Cl.

| | | |
|---|---|---|
| *H01L 31/0693* | (2012.01) | |
| *H01L 31/0687* | (2012.01) | |
| *H01L 31/02* | (2006.01) | |
| *H01L 23/31* | (2006.01) | |
| *H01L 29/06* | (2006.01) | |
| *H01L 29/20* | (2006.01) | |
| *H01L 29/861* | (2006.01) | |
| *H01L 29/868* | (2006.01) | |
| *H01L 29/88* | (2006.01) | |
| *H01L 31/0232* | (2014.01) | |
| *H01L 31/042* | (2014.01) | |

(52) U.S. Cl.
CPC ............ *H01L 29/20* (2013.01); *H01L 29/861* (2013.01); *H01L 29/868* (2013.01); *H01L 29/88* (2013.01); *H01L 31/02019* (2013.01); *H01L 31/02325* (2013.01); *H01L 31/042* (2013.01); *H01L 31/0687* (2013.01); *H01L 31/0693* (2013.01); *Y02E 10/544* (2013.01)

(58) Field of Classification Search
CPC ....... H01L 29/868; H01L 29/88; H01L 31/04; H01L 31/042
USPC ........................................................ 257/104
See application file for complete search history.

(56) References Cited

U.S. PATENT DOCUMENTS

| | | | | |
|---|---|---|---|---|
| 4,206,002 A * | 6/1980 | Sabnis | ................. | H01L 31/065 |
| | | | | 136/249 |
| 4,271,328 A * | 6/1981 | Hamakawa | ........... | H01L 31/076 |
| | | | | 136/249 |
| 4,598,164 A * | 7/1986 | Tiedje | .................... | B82Y 20/00 |
| | | | | 136/249 |
| 4,631,352 A * | 12/1986 | Daud | .................. | H01L 31/0687 |
| | | | | 136/249 |
| 4,667,059 A * | 5/1987 | Olson | .............. | H01L 31/03046 |
| | | | | 136/249 |
| 4,688,068 A * | 8/1987 | Chaffin | .................. | B82Y 20/00 |
| | | | | 136/249 |
| 4,926,230 A * | 5/1990 | Yamagishi | ........ | H01L 31/03762 |
| | | | | 136/249 |
| 5,223,043 A * | 6/1993 | Olson | ................. | H01L 31/0687 |
| | | | | 136/249 |
| 5,252,142 A * | 10/1993 | Matsuyama | ........ | H01L 31/0352 |
| | | | | 136/249 |
| 5,298,086 A * | 3/1994 | Guha | .................... | H01L 31/076 |
| | | | | 136/249 |
| 5,407,491 A * | 4/1995 | Freundlich | ........ | H01L 31/03042 |
| | | | | 117/105 |
| 5,800,630 A * | 9/1998 | Vilela | ............... | H01L 31/03042 |
| | | | | 136/249 |
| 6,239,354 B1 | 5/2001 | Wanlass | | |
| 6,300,558 B1 * | 10/2001 | Takamoto | ........... | H01L 31/0735 |
| | | | | 136/249 |
| 6,316,715 B1 * | 11/2001 | King | ................... | H01L 31/0304 |
| | | | | 136/249 |
| 6,864,414 B2 * | 3/2005 | Sharps | ................. | H01L 27/1421 |
| | | | | 136/249 |
| 7,488,890 B2 * | 2/2009 | Takamoto | ......... | H01L 31/03046 |
| | | | | 136/255 |
| 7,696,429 B2 | 4/2010 | Strobl | | |
| 8,075,723 B1 * | 12/2011 | Farris, III | ............. | B23K 26/38 |
| | | | | 156/253 |
| 8,138,410 B2 * | 3/2012 | Hovel | ................. | H01L 31/042 |
| | | | | 136/244 |
| 8,299,351 B2 * | 10/2012 | Hsu | .................. | H01L 21/02381 |
| | | | | 136/255 |
| 8,343,794 B2 * | 1/2013 | Frolov | ............ | H01L 31/035281 |
| | | | | 136/252 |
| 8,404,513 B2 * | 3/2013 | Matsushita | ......... | H01L 31/0687 |
| | | | | 136/243 |
| 8,580,602 B2 * | 11/2013 | Garnett | ............. | H01L 31/02966 |
| | | | | 438/84 |
| 8,613,984 B2 * | 12/2013 | Aslami | ................. | C23C 16/458 |
| | | | | 118/730 |
| 8,624,222 B2 * | 1/2014 | Liu | ................. | H01L 31/035236 |
| | | | | 136/249 |
| 8,697,481 B2 * | 4/2014 | Jones-Albertus | ....... | H01L 31/06 |
| | | | | 136/255 |
| 8,772,623 B2 * | 7/2014 | Wanlass | ............ | H01L 31/06875 |
| | | | | 136/249 |
| 8,795,854 B2 * | 8/2014 | Goyal | .................... | B82Y 10/00 |
| | | | | 257/64 |
| 8,852,994 B2 * | 10/2014 | Wojtczuk | ............ | H01L 31/0684 |
| | | | | 438/93 |
| 8,912,617 B2 * | 12/2014 | Zhang | ............... | H01L 31/02168 |
| | | | | 257/437 |
| 8,916,769 B2 * | 12/2014 | Hovel | .................... | B82Y 20/00 |
| | | | | 136/252 |
| 8,933,326 B2 * | 1/2015 | Sasaki | .............. | H01L 31/03046 |
| | | | | 136/255 |
| 8,951,827 B2 * | 2/2015 | Ahmari | ............... | H01L 31/0336 |
| | | | | 136/255 |
| 8,962,993 B2 | 2/2015 | Jones-Albertus et al. | | |
| 9,048,376 B2 * | 6/2015 | Lin | ...................... | H01L 31/052 |
| 9,054,254 B2 * | 6/2015 | Juso | ................. | H01L 31/022425 |
| 9,231,147 B2 * | 1/2016 | Stan | .................. | H01L 31/06875 |
| 9,249,016 B2 * | 2/2016 | Aria | ....................... | B82Y 30/00 |
| 9,263,611 B2 * | 2/2016 | Fidaner | ............... | H01L 31/0352 |
| 9,306,095 B2 | 4/2016 | Nobori | | |
| 9,508,890 B2 * | 11/2016 | Li | ........................ | H01L 31/0693 |
| 9,530,911 B2 * | 12/2016 | King | .................... | H01L 31/0352 |
| 9,666,738 B2 | 5/2017 | Fuhrmann | | |
| 9,947,823 B2 * | 4/2018 | King | ................... | H01L 31/0725 |
| 9,985,160 B2 * | 5/2018 | King | ................... | H01L 31/0725 |
| 9,997,659 B2 * | 6/2018 | King | ................... | H01L 31/0725 |
| 10,109,758 B2 * | 10/2018 | Campesato | ....... | H01L 31/03046 |
| 2003/0136442 A1 * | 7/2003 | Takamoto | ......... | H01L 31/0687 |
| | | | | 136/262 |
| 2006/0048811 A1 | 3/2006 | Krut et al. | | |
| 2008/0000523 A1 | 1/2008 | Hilgarth et al. | | |
| 2008/0163920 A1 | 7/2008 | Meusel et al. | | |
| 2010/0096001 A1 | 4/2010 | Sivananthan et al. | | |
| 2010/0122764 A1 * | 5/2010 | Newman | ......... | H01L 31/022425 |
| | | | | 156/247 |
| 2010/0147381 A1 * | 6/2010 | Haney | ................ | B01D 46/0046 |
| | | | | 136/259 |
| 2010/0229930 A1 * | 9/2010 | Fetzer | ................ | H01L 31/0687 |
| | | | | 136/255 |
| 2011/0005570 A1 * | 1/2011 | Jain | ........................ | B82Y 20/00 |
| | | | | 136/244 |
| 2011/0220175 A1 * | 9/2011 | Haney | ............... | H01L 31/03046 |
| | | | | 136/246 |
| 2011/0290312 A1 * | 12/2011 | Agui | ................... | H01L 31/1852 |
| | | | | 136/255 |
| 2012/0125392 A1 * | 5/2012 | Woo | .................. | H01L 31/0304 |
| | | | | 136/244 |
| 2012/0266803 A1 | 10/2012 | Zediker et al. | | |
| 2014/0076391 A1 * | 3/2014 | King | .................... | H01L 31/0725 |
| | | | | 136/255 |
| 2015/0295114 A1 * | 10/2015 | Meitl | ..................... | H01L 27/15 |
| | | | | 136/244 |
| 2015/0380591 A1 * | 12/2015 | Bett | .................... | H01L 31/0687 |
| | | | | 136/255 |
| 2016/0294189 A1 * | 10/2016 | Uno | ..................... | G05F 1/67 |
| 2017/0018675 A1 * | 1/2017 | Meitl | ..................... | H01L 31/165 |

FOREIGN PATENT DOCUMENTS

| | | |
|---|---|---|
| CN | 103545389 A | 1/2014 |
| CN | 103594539 A | 2/2014 |
| DE | 10 2010 001 420 A1 | 8/2011 |
| EP | 1 936 700 A2 | 6/2008 |
| JP | 2007-537584 A | 12/2007 |
| JP | 2008-512860 A | 4/2008 |
| JP | 2008177212 A | 7/2008 |

(56) References Cited

FOREIGN PATENT DOCUMENTS

| JP | 2015-505641 A | | 2/2015 | |
|----|---|---|---|---|
| JP | WO 2015/037663 | * | 3/2015 | ............ G06F 1/167 |
| TW | 201327875 A | | 7/2013 | |
| WO | WO 2013/088621 A | | 6/2013 | |
| WO | WO 2014/096200 | * | 6/2014 | ........... H01L 31/052 |
| WO | WO 2014/096200 A1 | | 6/2014 | |

OTHER PUBLICATIONS

Jung et al., "AlGaAs/GaInP heterojunction tunnel diode for cascade solar cell application", Journal of Applied Physics 74 (1993) pp. 2090-2093.*

Valdivia et al., "Five-volt vertically-stacked, single-cell GaAs photonic power converter," Proc. of Spie, vol. 9358, pp. 93580E-1-93580E-8 (Mar. 16, 2015).

Schubert et al., "High-Voltage GaAs Photovoltaic Laser Power Converters," IEEE Trans. on Electron Devices, vol. 56, No. 2, pp. 170-175 (2009).

Kalkhoran et al., "Cobalt disilicate intercell ohmic contaccts for multijunction photovoltaic energy converters," Appl. Phys. Lett., vol. 64, No. 15, pp. 1980-1982 (Apr. 11, 1994).

Bett et al., "III-V Solar cells Under Monochromatic Illumination," 33$^{rd}$ IEEE Photovoltaic Specialists Conf. (PSVC '08), pp. 1-5 (2008).

* cited by examiner

SCALABLE VOLTAGE SOURCE

This nonprovisional application claims priority under 35 U.S.C. § 119(a) to German Patent Application No. 10 2015 006 379.0, which was filed in Germany on May 18, 2015, and which is herein incorporated by reference.

BACKGROUND OF THE INVENTION

Field of the Invention

The invention relates to a scalable voltage source.

Description of the Background Art

From U.S. Pat. Nos. 4,127,862, 6,239,354 B1, DE 10 2010 001 420 AI, from Nader M. Kalkhoran, et al, "Cobalt disilicide intercell ohmic contacts for multijunction photovoltaic energy converters", Appl. Phys. Lett. 64, 1980 (1994) and from A. Bett et al, "III-V Solar cells under monochromatic illumination", Photovoltaic Specialists Conference, 2008, PVSC '08. 33rd IEEE, pages 1-5, ISBN:978-1-4244-1640-0, scalable voltage sources or also solar cells made of III-V materials are known.

SUMMARY OF THE INVENTION

It is therefore an object of the invention to provide an apparatus that further develops the prior art.

According to an exemplary embodiment of the invention, a scalable voltage source having a number N of mutually series-connected partial voltage sources designed as semiconductor diodes is provided, wherein each of the partial voltage sources comprises a semiconductor diode with a p-n junction, and the semiconductor diode has a p-doped absorption layer, wherein the p-absorption layer is passivated by a p-doped passivation layer with a wider band gap than the band gap of the p-absorption layer and the semiconductor diode has an n-absorption layer, wherein the n-absorption layer is passivated by an n-doped passivation layer with a wider band gap than the band gap of the n-absorption layer, and the partial source voltages of the individual partial voltage sources deviate by less than 20%, and between in each case two consecutive partial voltage sources, a tunnel diode is arranged, wherein the tunnel diode has a plurality of semiconductor layers with a wider band gap than the band gap of the p/n absorption layers and the semiconductor layers with the wider band gap each formed of a material with changed stoichiometry and/or other element composition than the p/n-absorption layers of the semiconductor diode, and the partial voltage sources and the tunnel diodes are monolithically integrated together and jointly form a first stack with a top surface and a bottom surface, and the number N of the partial voltage sources is greater than or equal to three, and the light strikes the first stack on the top surface, and the size of the illuminated area on the stack top surface is substantially the size of the area of the first stack on the top surface, and the first stack has a total thickness less than 12 µm, and at 300 K, the first stack has a source voltage greater than 3 volts, provided that the first stack is illuminated with a photon flux, and wherein in the direction of light incidence from the top surface of the first stack to the bottom surface of the first stack, the total thickness of the p and n-absorption layers of a semiconductor diode increases from the topmost diode to the lowest diode and the voltage source near the bottom surface of the stacks has a circumferential, shoulder-like step.

The correlation of the comparison of the illuminated area at the top surface of the stack can be with the size of the surface of the first stack at the top side, and can be a difference in the surface in particular lesser than 20% or preferably lesser than 10% or most preferably the two surfaces are equal.

The light for the illumination of the top surface of the stack can have a spectrum of wave lengths in the absorption area of the absorption layers. A monochromatic light can have a specific, i.e., absorbent wave length, i.e., a wave length in the absorption area of the absorption layers.

The total top surface of the first stack, i.e. the entire or substantially the entire surface can be illuminated by the light of a particular wave length. It should be noted that detailed studies have surprisingly shown that as opposed to the prior art, using the present monolithic stack approach advantageously results in source voltages above 3V.

An advantage of the inventive apparatus is that by connecting in series a plurality of partial voltage sources of a voltage source with voltage values also above four or more volts, a simple and cost-effective as well as reliable voltage source can be produced by means of a monolithically integrated construction. A further advantage is that by means of the stacked arrangement as opposed to the hitherto lateral arrangement with silicon diodes, more space is saved. In particular, the transmitter diode or light source only needs to illuminate the substantially smaller receiving surface of the stack.

In an embodiment, the partial source voltages of the individual partial voltage sources can deviate less than 10%. The applicability as a scalable voltage source, in particular as a voltage reference source, is thereby greatly improved. The term "scalability" can refer to the level of the source voltage of the total stack.

In an embodiment, the semiconductor diodes each can be formed of the same semiconductor material, wherein the semiconductor material of the diodes hereby has the same crystalline composition and wherein preferably, the stoichiometry is nearly or preferably exactly the same. It is also advantageous to arrange the first stack on a substrate. In one embodiment, the semiconductor material and/or the substrate formed of III-V materials. It is particularly preferred that the substrate comprises germanium or gallium arsenide and/or that the semiconductor layers have arsenic and/or phosphorus on the substrate. In other words, the semiconductor layers have layers containing As and P, i.e. layers made of GaAs or AIGaAs or InGaAs as examples of arsenide layers, and InGaP as an example of a phosphide layer.

A second voltage terminal can be formed on the bottom surface of the first stack and in particular, that the second voltage terminal is formed by the substrate.

In another embodiment, the semiconductor diodes can be formed of the same material as the substrate. One advantage is that then in particular the expansion coefficients of the two parts are alike. It is advantageous if the semiconductor diodes is formed of a III-V material. It is particularly preferred to use GaAs.

In an embodiment, a first voltage terminal can be formed on the top surface of the first stack as a circumferential metal contact near the edge or as a single contact surface on the edge.

The first stack can have a bottom surface smaller than 2 mm² or smaller than 1 mm². Studies have shown that it is advantageous to shape the bottom surface quadrangular. The bottom surface of the stack is preferably square in shape.

To achieve particularly high voltages, it is advantageous to design a second stack and to connect the two stacks in series with one another so that the source voltage of the first stack and the source voltage of the second stack can be added. Preferably, the first stack and the second stack are arranged adjacent to one another on a common carrier.

In an embodiment, the source voltage of the first stack deviates less than 15% from the source voltage of the second stack.

A semiconductor mirror can be arranged below the lowest semiconductor diode of the stack. A plurality of stacks can be arranged adjacent to one another on a semiconductor wafer or a semiconductor substrate wafer by performing a so-called mesa etching after the full-surface, preferably epitaxial production of the layers. To this end, a resist mask is produced via a mask process and subsequently, preferably wet chemical etching is performed to produce mesa trenches. The mesa etching can stop in the substrate or on the substrate.

In an embodiment, an intrinsic layer can be formed between the p absorption layer and the n-absorption layer of the respective diode. An intrinsic layer can be a semiconductor layer with a doping below 1E16 $1/cm^2$, preferably less than 5E15 $1/cm^2$, most preferably less than 1.5 E15 $1/cm^2$.

In an embodiment, each stack can have a circumferential, shoulder-shaped edge in the vicinity of the bottom surface, wherein at two immediately adjacent stacks, the circumferential edge is designed as a shared circumferential edge at the outer surfaces of the stack formation so that the voltage source has a circumferential edge.

The edge can be designed step-like or as a step. The edge or step surface hereby preferably mostly has a plane surface, wherein the normal of the edge or the step is designed to be parallel or nearly parallel to the normal of the surface of the first stack or to the normal of the surfaces of the respective stacks. It should be noted that the lateral surface of the edge or the step is designed to be mostly or exactly perpendicular to the surface of the edge or step.

The border of the edge or the step can be spaced at least 5 microns and maximally 500 microns apart in each case from each of the four lateral surfaces of the first stack or in each case from the lateral surfaces of multiple stacks. For example, the distance range of the border to the immediately adjoining lateral surface can be in each case between 10 microns and 300 microns. In particular, the distance range can be between 50 microns and 250 microns.

The lateral surfaces of the first stack and, for example, all lateral surfaces of the stack can be designed to be planar and in particular perpendicular or nearly perpendicular. In particular, the normals on lateral surfaces as compared to the normals of the adjoining edge surfaces or the normals of the top surfaces of the stack are at an angle range between 80° and 110°, i.e. the normal of a lateral surface and the edge surface immediately adjoining are substantially positioned orthogonally to one another. Preferably, the angle range is between 85° and 105°.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
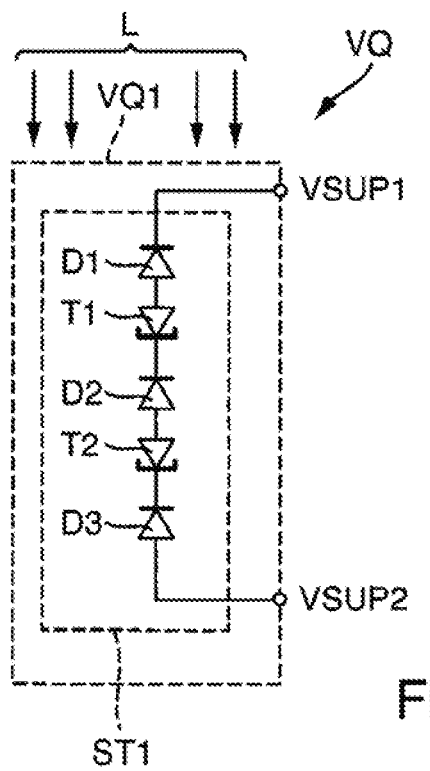
FIG. 1 illustrates an embodiment of a scalable voltage source with a stack.

The drawing in FIG. 1 shows a schematic view of an embodiment having a scalable voltage source VQ with a first stack ST1 with a top surface and a bottom surface having a number N equal to three diodes. The first stack ST1 has a series circuit of a first diode D1 and a first tunnel diode T1 and a second diode D2 and a second tunnel diode T2 and a third diode D3. A first voltage terminal VSUP1 is arranged on the top surface of the stack ST1, and a second voltage terminal VSUP2 is arranged on the bottom surface of the stack ST1. Here, the source voltage VQ1 of the first stack ST1 is made up of the partial voltages of the individual diodes D1 to D3. To this end, the first stack ST1 is exposed to a photon flux, i.e. to light L.

The first stack ST1 of the diodes D1 to D3 and the tunnel diodes TI and T2 is configured as a monolithically designed block, preferably made of the same semiconductor material.

Figure 2:
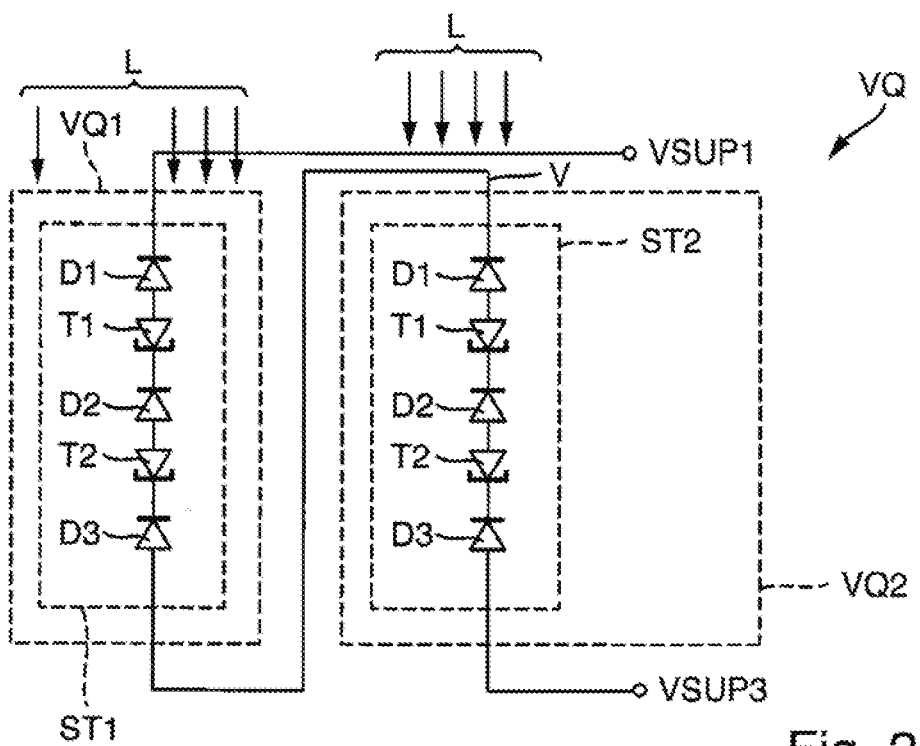
FIG. 2 illustrates an embodiment of a scalable voltage source with a plurality of stacks.

In the drawing in FIG. 2, an embodiment of an advantageous sequence of the first stack ST1 and a second stack ST2 is formed. Below, only the differences to the drawing in FIG. 1 are described. Like the first stack ST1, the second stack ST2 has a series circuit made up of three diodes with tunnel diodes arranged therebetween. Both stacks ST1 and ST2 are series-connected with one another so that the source voltage VQ1 of the first stack ST1 and the source voltage VQ2 of the second stack ST2 can be added, provided that both stacks ST1 and ST2 are exposed to the photon flux L.

In another embodiment which is not shown, the two stacks ST1 and ST2 mutually have a different number of diodes each connected to one another in a series circuit. In another embodiment which is not shown, at least the first stack ST1 and/or the second stack ST2 have more than three diodes connected in a series circuit. In this way, the voltage level of the voltage source VQ can be scaled. Preferably, the number N is within a range between four and eight. In a further embodiment which is not shown, both stacks ST1 and ST2 are connected in parallel to each other.

Figure 3:
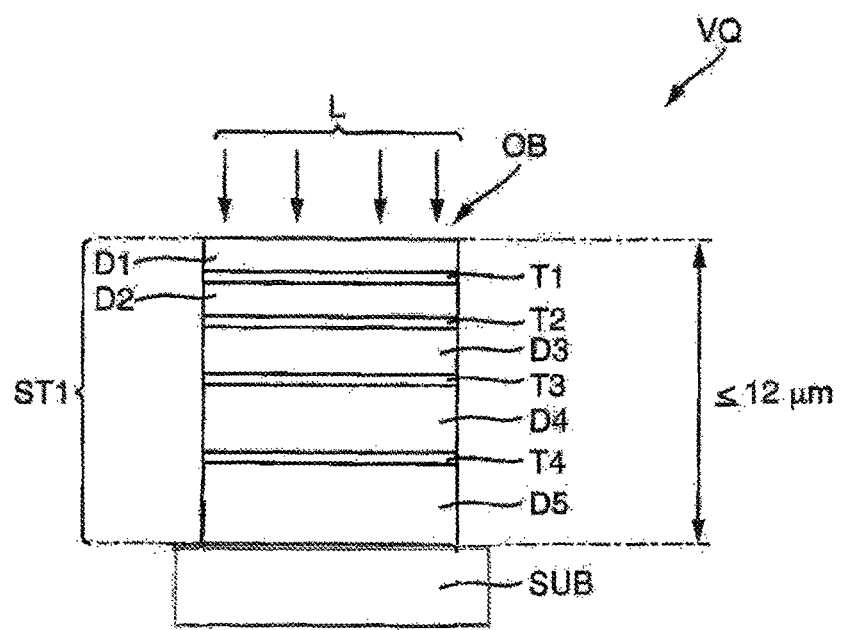
FIG. 3 illustrates an embodiment with a total of five diodes of various thicknesses of the absorption area.

In the drawing in FIG. 3, an embodiment of an advantageous sequence of semiconductor layers relative to the first stack ST1 is shown. Below, only the differences to the drawing in FIG. 1 are described. The first stack ST1 comprises a total of five partial series-connected voltage sources that are arranged as diodes D1 to D5. The light L strikes the top surface OB of the first diode D1. The top surface OB is virtually or completely illuminated. A tunnel diode T1-T4 is each arranged between two successive diodes D1-D5. With increasing distance of the individual diodes D1 to D5 from the top surface OB, the thickness of the absorption area increases, so that the lowest diode D5 has the thickest absorption area. Overall, the total thickness of the first stack ST1 is less than or equal to 12 μm. A substrate SUB is arranged below the lowest diode D5.

Figure 4:
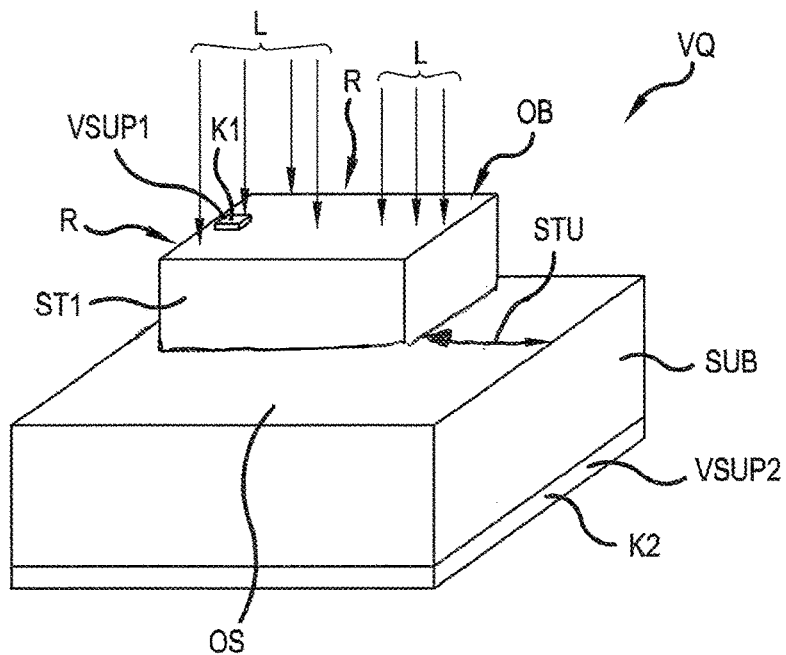
FIG. 4 illustrates a stack with a circumferential, shoulder-like step.
Figure 5:
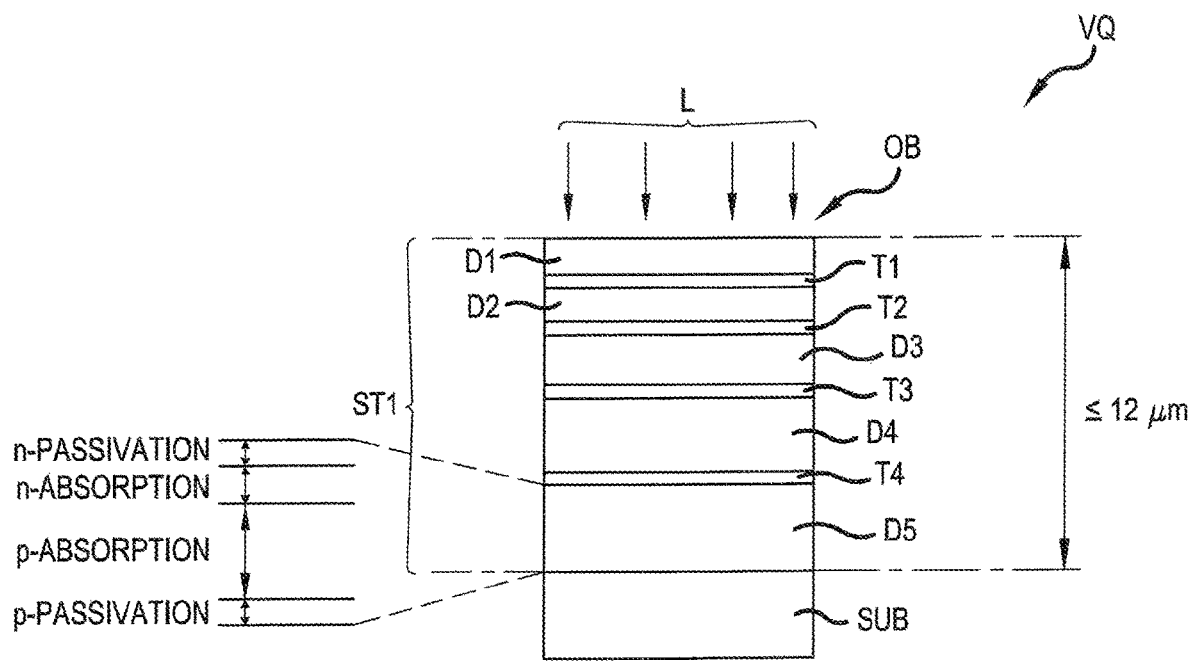
FIG. 5 illustrates a layer structure of a semiconductor diode.

In the drawing in FIG. 4, an embodiment of an advantageous sequence of semiconductor layers relative to the first stack ST1 is shown, having a circumferential, shoulder-like step. Below, only the differences to the drawing in FIG. 3 are described. On the top surface OB of the first stack ST1, a first metal terminal contact K1 is arranged on the edge R. The first terminal contact K1 is connected to the first voltage terminal VSUP1. The substrate SUB has a top side OS, wherein the top side OS of the substrate SUB is integrally connected to the lowest, i.e. the fifth diode D5. A thin nucleation layer and a buffer layer may be epitaxially produced on the substrate prior to the fifth diode being arranged on the substrate and being integrally connected to the top side OS of the substrate. The top side OS of the substrate SUB has a larger surface than the area on the bottom side of the first stack ST1. Consequently, a circumferential step STU is formed. The edge of the step STU is spaced apart from the immediately adjoining lateral surface of the first stack ST1 of the step by more than 5 microns and less than 500 microns, represented as the length of the reference numeral STU. On the bottom side of the substrate SUB, a second full-surface metal contact K2 is arranged. The second terminal contact K2 is connected to a second voltage terminal VSUP2.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A scalable voltage source comprising:
   at least three mutually series-connected partial voltage sources configured as semiconductor diodes, each of the partial voltage sources comprising a semiconductor diode, each semiconductor diode having a p-doped absorption layer and an n-doped absorption layer, the n-doped absorption layer being passivated by an n-doped passivation layer with a wider band gap than a band gap of the n-doped absorption layer, an output voltage of the individual partial voltage sources deviating from each of the other partial voltage sources by less than 20%; and
   at least two tunnel diodes, each of which is arranged between two successive partial voltage sources, each tunnel diode having a plurality of semiconductor layers with a wider band gap than a band gap of the p-doped absorption layer and n-doped absorption layer of the partial voltage source lying underneath, the plurality of semiconductor layers of each of the tunnel diodes with the wider band gap being formed of a material with changed stoichiometry or other element composition than the p-doped absorption layer and the n-doped absorption layer of the semiconductor diode laying underneath, the at least three partial voltage sources and the at least two tunnel diodes being monolithically integrated together and jointly forming a first stack, the first stack having a top side and a bottom side, and a number of the at least three partial voltage sources being greater than or equal to three,
   wherein the first stack has a total thickness of less than 12 μm,
   wherein, at 300 K, the first stack has a source voltage produced by the plurality of mutually series-connected partial voltage sources greater than 3 volts,
   wherein, in a direction from the top side of the first stack to the bottom side of the first stack, a total thickness of the p-doped absorption layer and n-doped absorption layer of a semiconductor diode increases from the topmost diode to the lowest diode, and
   wherein each p-doped absorption layer of each semiconductor diode is passivated by a p-doped passivation layer with a greater band gap than the band gap of the p-doped absorption layer.

2. The scalable voltage source according to claim 1, wherein the output voltages of the partial voltage sources deviate from each of the other partial voltage sources by less than 10%.

3. The scalable voltage source according to claim 1, wherein the first stack is arranged on a substrate and the substrate comprises a semiconductor material.

4. The scalable voltage source according to claim 1, wherein the first stack has a surface area of less than 2 mm$^2$ or less than 1 mm$^2$.

5. The scalable voltage source according to claim 4, wherein the surface area is quadrangular.

6. The scalable voltage source according to claim 1, wherein on the top side of the first stack, a first voltage terminal is formed as a first metal contact in a vicinity of an edge or on an edge.

7. The scalable voltage source according to claim 1, wherein, on the bottom side of the first stack, a second voltage terminal is arranged.

8. The scalable voltage source according to claim 7 wherein the second voltage terminal is formed by the substrate.

9. The scalable voltage source according to claim 1, wherein a second stack is formed and the first stack and the second stack are arranged adjacent to one another on a common carrier, and wherein the first and second stacks are series-connected to one another so that the source voltage of the first stack and the source voltage of the second stack are added together.

10. The scalable voltage source according to claim 1, wherein an intrinsic layer is arranged between the p-doped absorption layer and the n-doped absorption layer of the respective semiconductor diode.

11. The scalable voltage source according to claim 1, wherein the semiconductor diodes of the plurality of partial voltage sources and/or a substrate on which the semiconductor diodes are arranged is formed of a III-V material.

12. The scalable voltage source according to claim 1, wherein a substrate on which the semiconductor diodes of the plurality of partial voltage sources are arranged comprises germanium or gallium arsenide.

13. The scalable voltage source according to claim 1, wherein a semiconductor mirror is arranged below the lowest semiconductor diode of the first stack.

14. The scalable voltage source according to claim 1, wherein the plurality of semiconductor layers constituting a tunnel diode of the first stack comprise at least one semiconductor layer containing arsenide as well as at least one semiconductor layer containing phosphide.

15. The scalable voltage source according to claim 6, wherein the edge is spaced apart by at least 5 microns and maximally 500 microns from an adjacent lateral surface of the first stack.

16. A scalable voltage source comprising:
   a plurality of mutually series-connected partial voltage sources including a first semiconductor diode, a second semiconductor diode and a third semiconductor diode, each of the first semiconductor diode, the second semiconductor diode and the third semiconductor diode having a p-doped absorption layer and an n-doped absorption layer, the n-doped absorption layer being passivated by an n-doped passivation layer with a wider band gap than a band gap of the n-doped absorption layer, an output voltage of the individual partial voltage sources deviating from each of the other partial voltage sources by less than 20%;

a first tunnel diode arranged between the first semiconductor diode and the second semiconductor diode; and a second tunnel diode arranged between the second semiconductor diode and the third semiconductor diode, wherein the first tunnel diode and the second tunnel diode each has a plurality of semiconductor layers with a wider band gap than a band gap of the p-doped absorption layer and n-doped absorption layer of the semiconductor diode lying underneath, the plurality of semiconductor layers of the first tunnel diode and the second tunnel diode being formed of a material with changed stoichiometry or other element composition than the p-doped absorption layer and the n-doped absorption layer of the semiconductor diode laying underneath, wherein the first semiconductor diode, the second semiconductor diode, the third semiconductor diode, the first tunnel diode and the second tunnel diode are monolithically integrated together and jointly form a first stack having a top side and a bottom side, wherein the first stack has a total thickness of less than 12 µm, wherein, at 300 K, the first stack has a source voltage produced by the plurality of mutually series-connected partial voltage sources greater than 3 volts, and wherein, in a direction from the top side of the first stack to the bottom side of the first stack, a total thickness of the p-doped absorption layer and n-doped absorption layer of a semiconductor diode increases from the topmost diode to the lowest diode.

\* \* \* \* \*